(12) United States Patent
Sonoda et al.

(10) Patent No.: US 9,947,894 B2
(45) Date of Patent: Apr. 17, 2018

(54) SEALING FILM, ORGANIC EL ELEMENT, AND ORGANIC EL DISPLAY DEVICE

(71) Applicant: Sharp Kabushiki Kaisha, Sakai, Osaka (JP)

(72) Inventors: Tohru Sonoda, Sakai (JP); Takeshi Hirase, Sakai (JP); Tetsuya Okamoto, Sakai (JP); Tohru Senoo, Sakai (JP); Seiji Fujiwara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/310,479

(22) PCT Filed: May 7, 2015

(86) PCT No.: PCT/JP2015/063192
§ 371 (c)(1),
(2) Date: Nov. 11, 2016

(87) PCT Pub. No.: WO2015/174318
PCT Pub. Date: Nov. 19, 2015

(65) Prior Publication Data
US 2017/0084866 A1    Mar. 23, 2017

(30) Foreign Application Priority Data

May 16, 2014    (JP) .................................. 2014-102529

(51) Int. Cl.
*H01L 51/52*    (2006.01)
*H01L 51/50*    (2006.01)
(Continued)

(52) U.S. Cl.
CPC .......... *H01L 51/5246* (2013.01); *H01L 51/50* (2013.01); *H01L 51/5253* (2013.01);
(Continued)

(58) Field of Classification Search
CPC ............ H01L 27/3246; H01L 27/3283; H01L 51/5237–51/5259
See application file for complete search history.

(56) References Cited

U.S. PATENT DOCUMENTS

2001/0050373 A1 * 12/2001 Yamazaki ........... H01L 27/3244
257/103
2003/0164677 A1 * 9/2003 Miyaguchi .......... H01L 51/5253
313/504
(Continued)

FOREIGN PATENT DOCUMENTS

JP    2006-024421 A    1/2006
JP    2007-157470 A    6/2007
(Continued)

OTHER PUBLICATIONS

Machine translation of JP 2006024421 A.*
Official Communication issued in International Patent Application No. PCT/JP2015/063192, dated Jul. 14, 2015.

*Primary Examiner* — Bryan Junge
(74) *Attorney, Agent, or Firm* — Keating & Bennett, LLP (57) ABSTRACT

Provided is a TFT substrate (substrate); a second electrode (vapor-deposited membrane) that is formed on the TFT substrate and includes a protruding portion; and a sealing membrane provided so as to cover the second electrode, wherein, when σ represents an absolute value of a stress of the sealing membrane, t represents a thickness of the sealing membrane, and P represents a sum of a product of an oblique side length and an oblique side slope in a minute region on an oblique side of the protruding portion, a value of an index N expressed by the expression (N=σ·t·P) is less than or equal to 935 MPa·μm².

13 Claims, 7 Drawing Sheets

(51) Int. Cl.
*H05B 33/04* (2006.01)
*H01L 27/32* (2006.01)

(52) U.S. Cl.
CPC .......... *H05B 33/04* (2013.01); *H01L 27/3244* (2013.01); *H01L 2251/558* (2013.01)

(56) References Cited

U.S. PATENT DOCUMENTS

| | | |
|---|---|---|
| 2004/0139914 A1* | 7/2004 | Yamazaki ................ C23C 14/12 118/719 |
| 2005/0084214 A1* | 4/2005 | Hayashi ................. B82Y 20/00 385/40 |
| 2007/0164666 A1 | 7/2007 | Oosono et al. |
| 2007/0210702 A1* | 9/2007 | Nakamura .......... H01L 51/0024 313/504 |
| 2011/0140164 A1 | 6/2011 | Seo et al. |
| 2013/0210199 A1 | 8/2013 | Chen et al. |
| 2015/0028306 A1* | 1/2015 | Kim .................... H01L 51/5259 257/40 |
| 2015/0044442 A1* | 2/2015 | Huang ................. H04B 1/3888 428/216 |
| 2015/0280172 A1* | 10/2015 | Nishinohara ..... H01L 29/78606 257/40 |

FOREIGN PATENT DOCUMENTS

| | | |
|---|---|---|
| JP | 2007-220646 A | 8/2007 |
| JP | 2009-176756 A | 8/2009 |
| JP | 2011-086578 A | 4/2011 |
| JP | 2011-138669 A | 7/2011 |
| JP | 2013-101984 A | 5/2013 |
| TW | 201341580 A | 10/2013 |

\* cited by examiner

SEALING FILM, ORGANIC EL ELEMENT, AND ORGANIC EL DISPLAY DEVICE

TECHNICAL FIELD

The present invention relates to a sealing film, an organic EL (electroluminescence) element using the same, and an organic EL display device.

BACKGROUND ART

In recent years, flat panel displays have been utilized in various products and various fields, and there has been demand for a larger size, higher image quality, and lower power consumption in such flat panel displays.

Under such circumstances, organic EL display devices including an organic EL (electroluminescence) element using the electro luminescence of an organic material have been garnering great attention as all-solid flat panel displays capable of being driven at a low voltage and having good high-speed responsiveness, good self-emission characteristics, and the like.

For example, in an organic EL display device of the active matrix type, a thin film-like organic EL element is provided on a substrate on which TFTs (thin film transistors) are provided. In the organic EL element, an organic EL layer including an emissive layer is stacked between a pair of electrodes. The TFTs are connected to one of the pair of electrodes. Then, a voltage is applied between the pair of electrodes to cause the emissive layer to emit light, whereby an image is displayed.

For the above-described conventional organic EL display device, it has been proposed to provide the organic EL element with a sealing film having a sealing membrane in order to prevent the organic EL element from being degraded by moisture and oxygen.

As with the case of the liquid crystal display device, a higher definition has been demanded for the above-described conventional organic EL display device. However, if such a demand for higher definition is to be met, the distance (pitch) between two adjacent sub-pixels is reduced. Accordingly, for the conventional organic EL display device, an edge cover and the like provided between sub-pixels need to be formed with lines and spaces that are very narrow. Further, to achieve such narrow lines and spaces, i.e., high resolution, it is necessary, for example, to minimize the fluidization caused by reflowing during heat curing of an edge cover (vapor-deposited membrane), and to form end portions of the edge cover in a steep pattern. As a result, in the conventional organic EL display device, for example, the oblique sides at end portions of the edge cover have a steep shape.

In the conventional organic EL display device, the reduction of the distance between adjacent two sub-pixels may cause a phenomenon in which a current is leaked in the layer direction of the organic EL layer deposited over the entire pixel, resulting in color mixture. That is, for example, a hole that has entered the organic EL layer from the first electrode at a given sub-pixel travels through the organic EL layer in the layer direction thereof and enters the organic EL layer at the adjacent sub-pixel, thus contributing to light emission in that sub-pixel. Therefore, to solve the problem of color mixture, there have been attempts to increase the thickness of the edge cover so as to increase the effective distance to reach the adjacent sub-pixel, or to make oblique sides of the edge cover steep so as to reduce the thickness of the organic EL layer on the oblique sides, thus increasing the electrical resistance in the layer direction.

As described above, with the conventional organic EL display device, for example, the oblique sides of end portions of the edge cover are formed to have a steep shape or the thickness of the edge cover is increased in order to increase the definition. Consequently, highly dense and sharply defined protruding portions (uneven portions) are formed on the substrate, as a result of which the sealing membrane of the sealing film tends to undergo peeling.

Therefore, for the above-described conventional organic EL display device, it has been proposed to provide a planarization layer included in the conventional sealing film on a substrate, thereby reducing a level difference created by the protruding portions on the substrate, as described in, for example, Patent Document 1 below. With the conventional organic EL display device, a gas barrier layer that completely covers the planarization layer is included in the sealing film to enable preventing moisture and a gas such as oxygen from flowing into the planarization layer.

PRIOR ART DOCUMENTS

Patent Document

[Patent Document 1] JP 2007-157470A

DISCLOSURE OF INVENTION

Problem to be Solved by the Invention

However, since the above-described conventional sealing film is provided with the planarization layer, the number of production steps is increased, resulting in the problem of a cost increase. Further, since the conventional organic EL display device is provided with the gas barrier layer so as to cover the planarization layer, it is necessary to separately form the pattern of the planarization layer and the pattern of the gas barrier layer, so that the number of the production steps is increased, resulting in the problem of a cost increase.

In view of the forgoing problems, it is an object of the present invention to provide a sealing film that can be easily produced at a low cost even when higher definition is achieved, an organic EL element using the same, and an organic EL display device.

Means for Solving Problem

In order to attain the above-described object, a sealing film according to the present invention is a sealing film including:

a substrate;

a vapor-deposited membrane that is formed on the substrate and includes a protruding portion; and a sealing membrane provided so as to cover the vapor-deposited membrane, wherein, when σ represents an absolute value of a stress of the sealing membrane, t represents a thickness of the sealing membrane, and P represents a sum of a product of an oblique side length and an oblique side slope in a minute region on an oblique side of the protruding portion, a value of an index N expressed by Expression (1) below is less than or equal to 935 MPa·μm²:

$$N = \sigma \cdot t \cdot P \qquad (1)$$

In the sealing film configured in the above-described manner, the value of the index N expressed by Expression (1) above is set to be less than or equal to 935 MPa·µm². The present inventors have found that this configuration can prevent the occurrence of peeling in the sealing membrane. The present invention has been made based on the above-described knowledge, and can form a sealing film that can be easily produced at a low cost even when higher definition is achieved.

In the above-described sealing film, it is preferable that a height dimension of the protruding portion has a value within a range of 0.1 µm to 10 µm.

In this case, it is possible to reliably prevent the occurrence of peeling in the sealing membrane.

In the above-described sealing film, it is preferable that the sealing membrane is formed of a stacked structure including an inorganic layer and an organic layer.

In this case, it is possible to easily enhance the sealing properties of the sealing membrane.

The above-described sealing film may include:
a first sealing membrane serving as the sealing membrane;
a buffer layer that is provided so as to cover the first sealing membrane and is formed of a material having elasticity to reduce a level difference created by the protruding portion in the first sealing membrane; and
a second sealing membrane provided so as to cover the buffer layer.

In this case, it is possible to reduce a level difference created by the protruding portion in the first sealing membrane, and prevent the stress of the second sealing membrane from being transmitted to the first sealing membrane by using the elasticity of the buffer layer, thus making it possible to reliably prevent the occurrence of peeling in the first sealing membrane.

In the above-described sealing film, it is preferable that the buffer layer has a thickness larger than a dimension of the level difference in the first sealing membrane.

In this case, a level difference created by the protruding portion in the first sealing membrane can be reliably reduced.

An organic EL element according to the present invention is an organic EL element in which any of the above-described sealing films is used.

With the above-described organic EL element configured in the above-described manner, it is possible to configure an organic EL element that can be easily produced at a low cost even when higher definition is achieved.

An organic EL display device according to the present invention is an organic EL display device in which the above-described organic EL element is used.

With the organic EL display device configured in the above-described manner, it is possible to configure an organic EL display device that can be easily produced at a low cost even when higher definition is achieved.

The above-described organic EL display device may include:
an opposing substrate that opposes the substrate; and
a sealing member that encapsulates the organic EL element between the substrate and the opposing substrate.

In this case, it is possible to more reliably prevent degradation of the organic EL element.

In the above-described organic EL display device, it is preferable that a filler layer is provided between the substrate, the opposing substrate, and the sealing member.

In this case, the sealing properties for the organic EL element can be further enhanced.

Effects of the Invention

According to the present invention, it is possible to provide a sealing film that can be easily produced at a low cost even when higher definition is achieved, an organic EL element using the same, and an organic EL display device.

DESCRIPTION OF THE INVENTION

Hereinafter, preferred embodiments of a sealing film, an organic EL element, and an organic EL display device according to the present invention will be described with reference to the drawings. Note that the following description shows a case where the present invention is applied to an organic EL display device by way of an example. The dimensions of the constituent members in the drawings are not faithful representation of the dimensions of actual constituent members, dimensional ratios of those members, and the like.

First Embodiment

Figure 1:
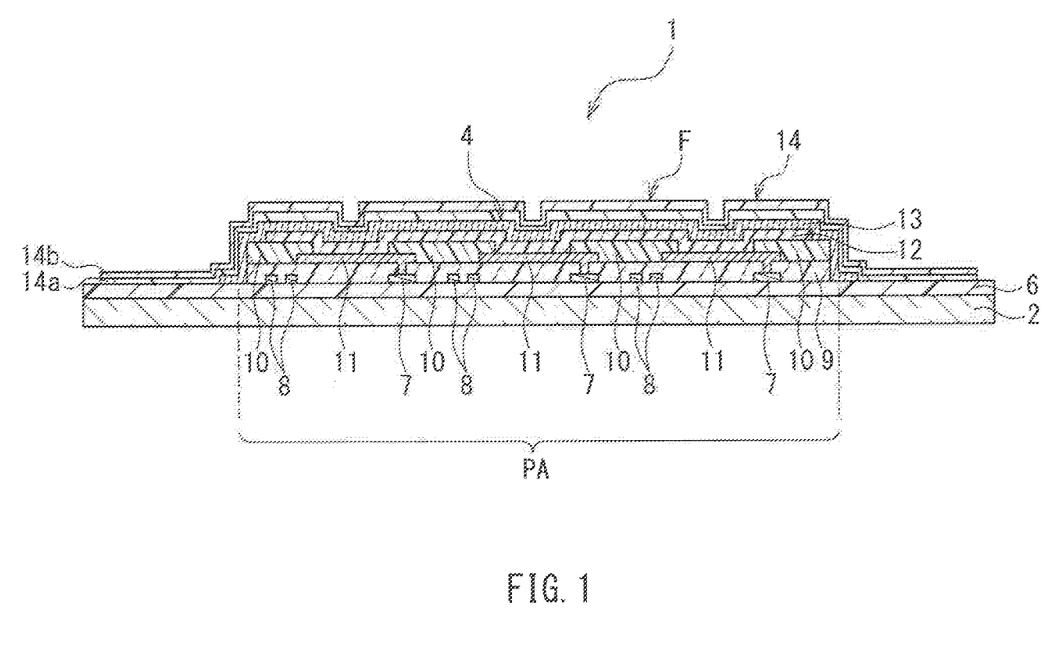
FIG. 1 is a cross-sectional view showing a cross section of an organic EL display device according to a first embodiment of the present invention.

FIG. 1 is a cross-sectional view showing a cross section of an organic EL display device according to a first embodiment of the present invention. In FIG. 1, an organic EL display device 1 of the present embodiment includes a TFT substrate 2 serving as a substrate, and an organic EL element 4 provided on the TFT substrate 2 as an electro luminescence element.

In the organic EL display device 1 of the present embodiment, the organic EL element 4 constitutes a rectangular pixel area PA including a plurality of pixels (including a plurality of sub-pixels), and the organic EL element 4 is sealed by a sealing membrane 14 included in a sealing film F of the present embodiment. The pixel area PA constitutes a display portion of the organic EL display device 1 and is configured to display information. That is, as will be described in detail later, in the pixel area PA, a plurality of pixels (a plurality of sub-pixels) are arranged in a matrix configuration, and the pixel area PA is configured to display information by the organic EL element 4 emitting light for each sub-pixel. Note that as the plurality of sub-pixels, for example, RGB sub-pixels that are colored into red (R), green (G), and blue (B), respectively are provided.

In FIG. 1, the TFT substrate 2 is formed of, for example, a glass material or a film having flexibility (bendability). Further, the TFT substrate 2 is provided with an underlying film (insulating film) 6 such that the underlying film 6 covers the entire surface of the TFT substrate 2. As illustrated in FIG. 1, in the organic EL display device 1, a TFT (thin film transistor) 7 is provided on the underlying film 6 for each sub-pixel of the pixel area PA. On the underlying film 6, wirings 8 including a plurality of source lines (signal lines) and a plurality of gate lines that are provided in a matrix configuration are formed. A source driver and a gate driver are connected to each source line and each gate line, respectively (not shown), and are configured to drive the TFT 7 provided for each sub-pixel, in accordance with an externally input image signal. The TFT 7 functions as a switching element that controls light emission of the corresponding sub-pixel, and is configured to control light emission of one of red (R), green (G), and blue (B) sub-pixels formed by the organic EL element 4.

Note that the underlying film 6 is used for preventing the characteristics of the TFTs 7 from being degraded by diffusion of impurities from the TFT substrate 2 to the TFTs 7, and may be omitted if there is no worries for such degradation.

When the TFT substrate 2 is a film having flexibility, a moisture barrier layer formed of an inorganic film of silicon nitride, silicon oxynitride or the like may be formed in advance on the TFT substrate 2 in order to prevent degradation of the TFTs 7 and the organic EL element 4 by penetration (entry) of moisture and oxygen from the outside.

As shown in FIG. 1, on the TFT substrate 2, an interlayer insulating film 9, an edge cover 10, and a first electrode 11 of the organic EL element 4 are formed. The interlayer insulating film 9 also functions as a planarization film, and is provided on the underlying film 6 so as to cover the TFTs 7 and the wirings 8. The edge cover 10 is formed on the interlayer insulating film 9 so as to cover edges of the pattern of the first electrode 11. The edge cover 10 also functions as an insulation layer for preventing a short circuit between the first electrode 11 and a second electrode 13, which will be described later. The first electrode 11 is connected to the TFTs 7 via contact holes formed in the interlayer insulating film 9.

The openings of the edge cover 10, i.e., portions where the first electrode 11 is exposed substantially constitute the emissive region of the organic EL element 4. As described above, the organic EL display device 1 of the present embodiment is configured to emit light of one of RGB so as to perform full-color display. Further, the organic EL display device 1 of the present embodiment constitutes a display device of the active matrix type that includes TFTs (thin film transistors) 7.

As shown in FIG. 1, an organic EL layer 12 and a second electrode 13 are formed on the first electrode 11, and the first electrode 11, the organic EL layer 12, and the second electrode 13 constitute the organic EL element 4. That is, the organic EL element 4 is a light-emitting element capable of high-luminance light emission by low-voltage direct-current driving, for example, and includes the first electrode 11, the organic EL layer 12, and the second electrode 13.

Specifically, when the first electrode 11 is an anode, a hole injection layer, a hole transport layer, an emissive layer, an electron transport layer, an electron injection layer, and so forth are stacked (not shown) in this order from the first electrode 11 side as the organic EL layer 12, and the second electrode 13 serving as a cathode is further formed. Apart from the configuration given in this description, it is possible to adopt a single layer having two or more functions such as a layer serving as both the hole injection layer and the hole transport layer. A carrier blocking layer or the like may be inserted in the organic EL layer 12, as needed.

On the other hand, when the second electrode 13 is an anode, the order of the layers in the organic EL layer 12 is reversed from the order described above.

When the first electrode 11 is formed of a transmissive electrode or a semi-transmissive electrode and the second electrode 13 is formed of a reflective electrode, the organic EL display device 1 will be an organic EL display device of the bottom-emission type in which light is emitted from the TFT substrate 2 side. That is, the organic EL display device 1 of the bottom-emission type is configured such that the surface of the first electrode 11 that faces the TFT substrate 2 constitutes an effective light-emitting surface of the organic EL element 4 and light is emitted therefrom to the outside.

Conversely, when the first electrode 11 is formed of a reflective electrode and the second electrode 13 is formed of a transmissive electrode or a semi-transmissive electrode, the organic EL display device 1 will be an organic EL display device of the top-emission type in which light is emitted from the sealing membrane 14. That is, the organic EL display device 1 of the top-emission type is configured such that the surface of the first electrode 11 that faces the sealing membrane 14 constitutes an effective light-emitting surface of the organic EL element 4 and light is emitted therefrom to the outside.

As described above, the organic EL display device 1 of the present embodiment is configured such that the organic EL element 4 is sealed by the sealing membrane 14, and penetration (entry) of moisture and oxygen from the outside is prevented by the sealing membrane 14 so as to prevent degradation of the organic EL element 4.

As shown in FIG. 1, the sealing membrane 14 is formed of for example, a stacked structure including an inorganic layer 14a provided on the organic EL element 4 side and an organic layer 14b provided so as to cover the inorganic layer 14a. For the inorganic layer 14a, for example, silicon nitride, silicon oxide, silicon oxynitride, or aluminum oxide is used. For the organic layer 14b, for example, silicon carbide oxide, acrylate, polyurea, parylene, polyimide, or polyamide is used.

Note that apart from the configuration given in this description, the sealing membrane 14 may be formed of a monolayer structure of an inorganic layer, or a stacked structure including three or more combined layers of an inorganic layer and an organic layer.

In the organic EL display device 1 of the present embodiment, the organic EL layer 12 and the second electrode 13 are formed by using, for example, a vapor deposition method. As will be described in detail later, the organic EL layer 12 and the second electrode 13 constitute a vapor-deposited membrane including protruding portions (uneven portions). That is, the edge cover 10 present under the vapor-deposited membrane is formed by using, for example, a photolithography method. However, for example, when oblique sides of end portions of the edge cover 10 are formed to have a steep shape or the thickness of the edge cover 10 is increased in order to increase the definition of the organic EL display device 1, highly dense and sharply defined protruding portions (uneven portions) are formed on the edge cover 10. Then, when the above-described vapor-deposited membrane is formed on the edge cover 10 including such protruding portions (uneven portions), the protruding portions (uneven portions) are also formed on the vapor-deposited membrane. As shown in FIG. 1, the sealing membrane 14 is formed on an underlayer including the above-described protruding portions, and is configured to have a shape having a level difference corresponding to the protruding portions.

Further, the organic EL display device 1 of the present embodiment includes a sealing film F of the present embodiment. That is, the sealing film F includes a TFT substrate 2 serving as a substrate, the vapor-deposited membrane (i.e., the organic EL layer 12 and the second electrode 13) that is formed on the TFT substrate 2 and includes protruding portions and a sealing membrane 14 provided so as to cover the vapor-deposited membrane, and the sealing film F is configured to seal the organic EL element 4 of the TFT substrate 2.

The sealing membrane 14 is formed by using, for example, a CVD method, a sputtering method, or an ALD (Atomic Layer Deposition) method. In particular, the use of a CVD method or an ALD method is preferable in that a sealing membrane 14 with higher level-difference coverage can be readily formed. On the other hand, the sealing membrane 14 having high sealing performance tends to have a high density and a high stress. Although a sealing membrane 14 having a low stress while having a high density may be formed by reducing the deposition rate, this will result in a reduced device tact and an increased cost, and therefore is not desirable.

With the organic EL display device 1 of the present embodiment, as will be described in detail later, a value of an index is obtained in advance, the value of an index being defined by the membrane stress and thickness of the sealing membrane 14 and the shape of an oblique side at an uneven portion of the vapor-deposited membrane in the sealing film F. Then, with the organic EL display device 1 of the present embodiment, the sealing membrane 14 is configured based on the obtained value of the index, thereby preventing the occurrence of peeling in the sealing membrane 14.

Next, a pixel structure in the organic EL display device 1 of the present embodiment will be described in detail with reference to FIG. 2.

Figure 2:
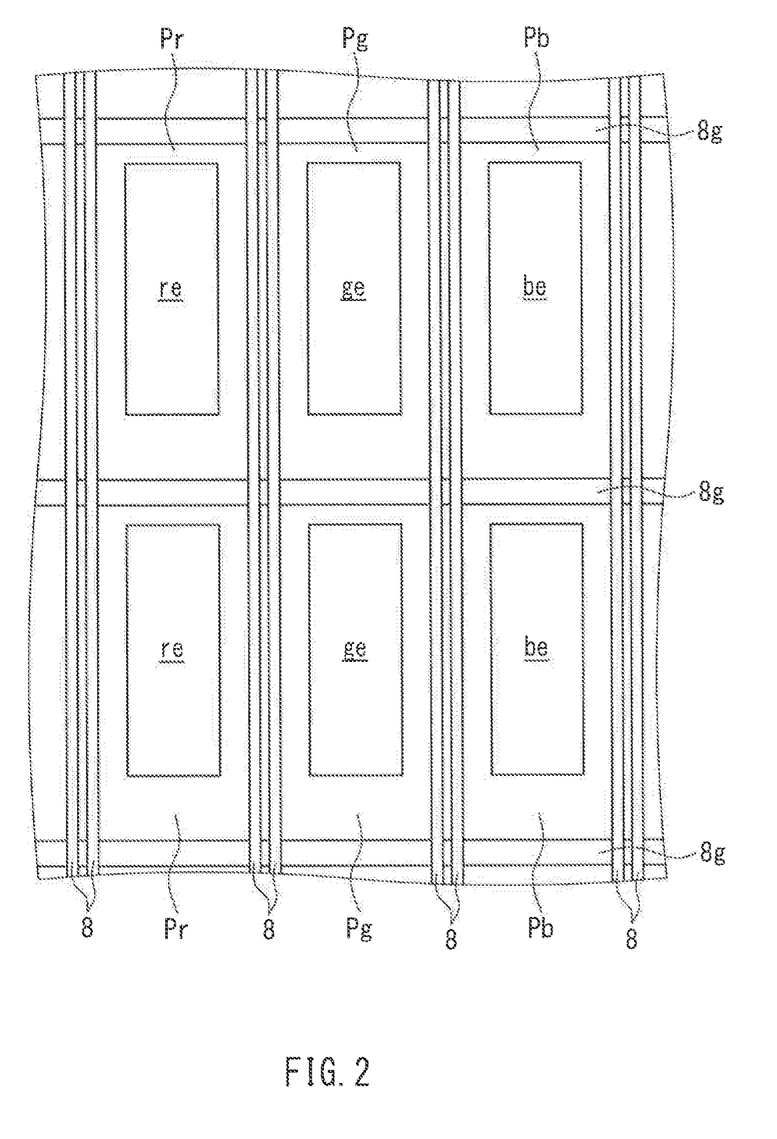
FIG. 2 is an enlarged plan view illustrating a pixel configuration of the organic EL display device.

FIG. 2 is an enlarged plan view illustrating a pixel configuration of the above-described organic EL display device.

As shown in FIG. 2, in the organic EL display device 1 of the present embodiment, red, green, and blue sub-pixels Pr, Pg, and Pb (hereinafter collectively referred to as "sub-pixels P") that emits red (R) light, green (G) light, and blue (B) light, respectively, are provided in a matrix configuration in the pixel area PA (FIG. 1).

That is, each of the plurality of sub-pixels P is defined by two signal lines 8 and gate lines 8g connected to the gates of the TFTs 7. Specifically, in the pixel area of each sub-pixel P, the dimension in the left-right direction in FIG. 2 is a dimension between the center line between two signal lines 8 that are disposed in proximity to each other and the center line between two signal lines 8 adjacent in the left-right direction in FIG. 2 to the two signal lines 8 disposed in proximity to each other. The dimension in the up-down direction in FIG. 2 is the center-to-center dimension between two gates line 8g that are adjacent to each other. The area of the pixel area of each sub-pixel P is defined by the dimension in the left-right direction and the dimension in the up-down direction in FIG. 2 described above.

In the pixel area PA, one pixel is composed of a set of red, green, and blue sub-pixels Pr, Pg, and Pb.

A portion of a red sub-pixel Pr that is exposed from an opening re of the edge cover 10 constitutes an effective emissive region of the red sub-pixel Pr. Likewise, a portion of a green sub-pixel Pg that is exposed from an opening ge of the edge cover 10 constitutes an effective emissive region of the green sub-pixel Pg, and a portion of a blue sub-pixel Pb that is exposed from an opening be of the edge cover 10 constitutes an effective emissive region of the blue sub-pixel Pb.

Next, the above-described value of the index in the organic EL display device 1 of the present embodiment will be described in detail with reference to FIGS. 3 to 6.

Figure 3:
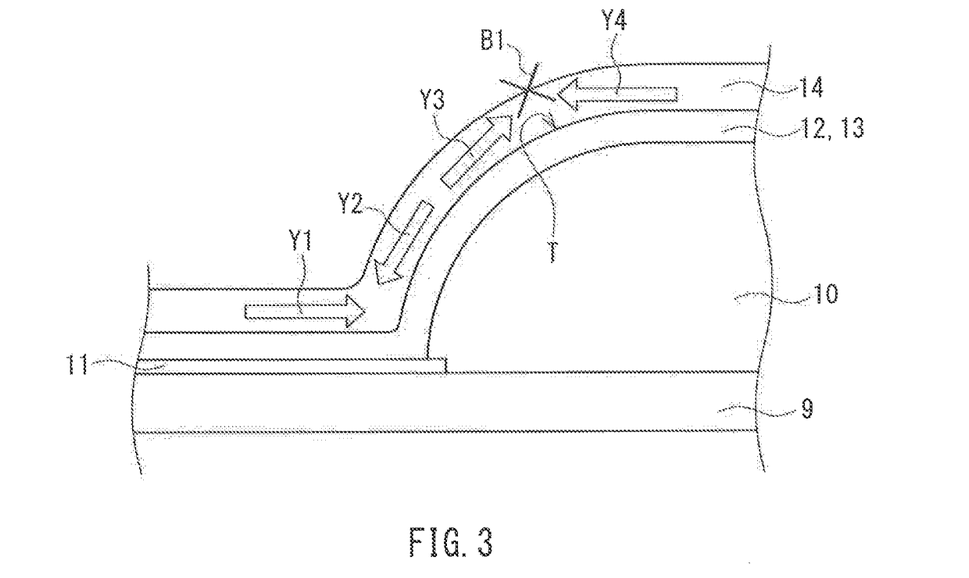
FIG. 3 is a diagram illustrating a force acting on a sealing membrane provided in the organic EL display device.
Figure 4:
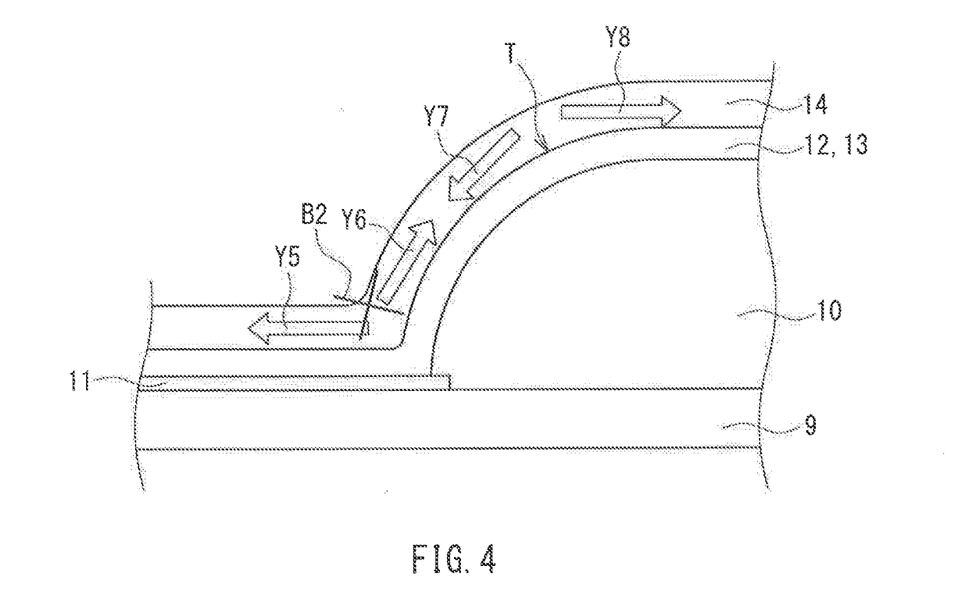
FIG. 4 is a diagram illustrating another force acting on a sealing membrane provided in the organic EL display device.
Figure 5:
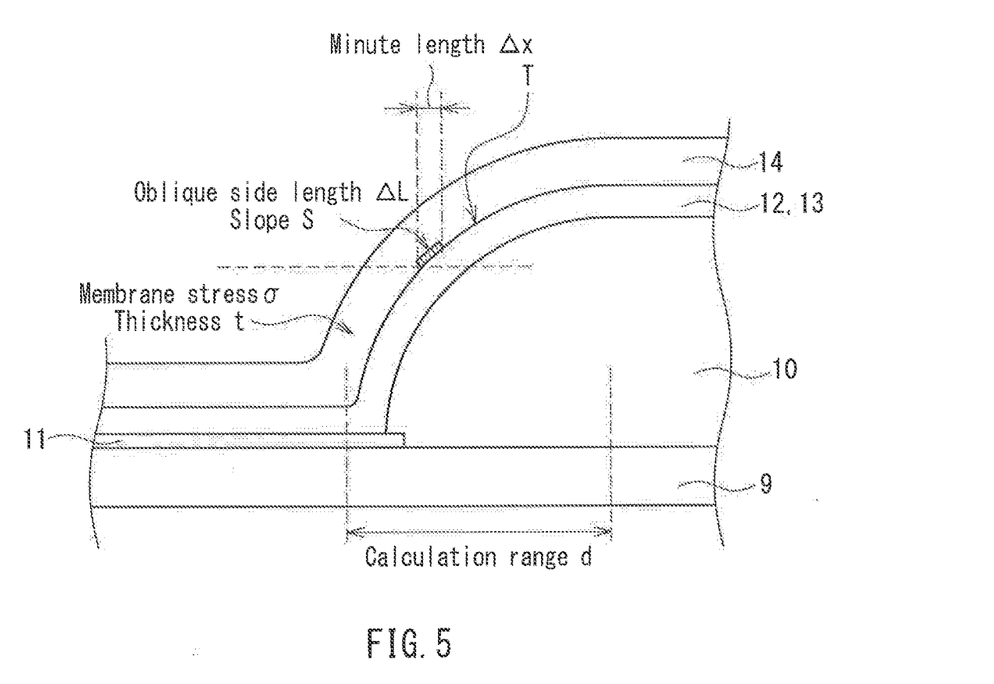
FIG. 5 is a diagram illustrating an index N in the organic EL display device.
Figure 6:
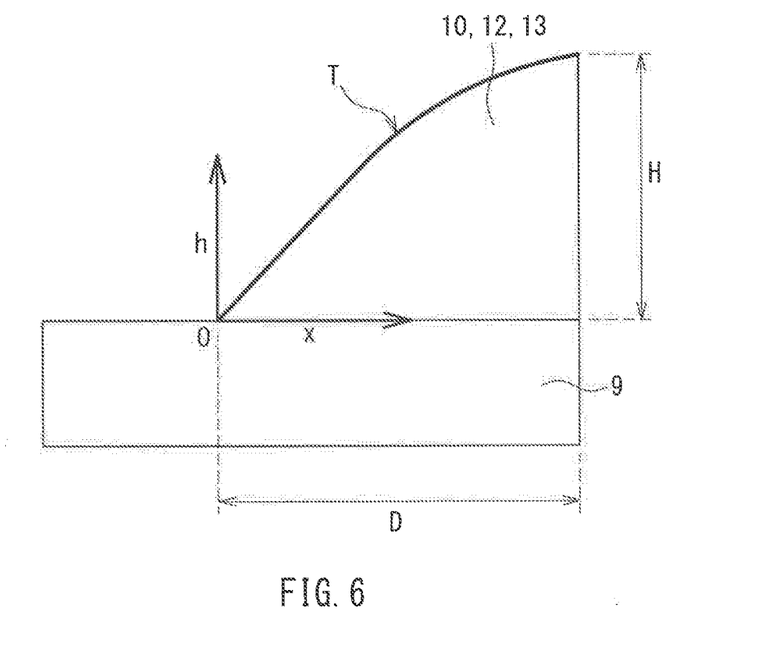
FIG. 6 is a diagram illustrating a case where the shape of an oblique side of a protruding portion created in the organic EL display device is approximated with a sine function.

FIG. 3 is a diagram illustrating a force acting on a sealing membrane provided in the organic EL display device. FIG. 4 is a diagram illustrating another force acting on a sealing membrane provided in the organic EL display device. FIG. 5 is a diagram illustrating an index N in the organic EL display device. FIG. 6 is a diagram illustrating a case where the shape of an oblique side of a protruding portion created in the organic EL display device is approximated with a sine function.

First, a peeling phenomenon in the sealing membrane 14 formed on the protruding portion will be described with reference to FIG. 3.

In FIG. 3, since the edge cover 10 is formed so as to cover an end portion of the first electrode 11, a protruding portion (uneven portion) is created on the edge cover 10, and a level difference due to the protruding portion has been created. Further, on the organic EL layer 12 and the second electrode 13, a protruding portion T in conformity with the protruding portion on the edge cover 10 is formed. Accordingly, the sealing membrane 14 is provided on an underlayer on which the above-described protruding portion T is formed.

As described above, in a structure in which the protruding portion T is present on the underlayer of the sealing membrane 14, the stress of the sealing membrane 14 is concentrated at the protruding portion T. In other words, stresses parallel to the sealing membrane 14 cancel each other when the sealing membrane 14 is formed on a flat membrane, but they cannot cancel each other when the protruding portion T is present.

Specifically, for example, in the case of a sealing membrane 14 having a compressive stress as its stress, the sealing membrane 14 tries to stretch, but the cancellation between upward stresses is weak in an upper portion of the oblique surface of the protruding portion T, as indicated by the arrows Y3 and Y4 in FIG. 3. Therefore, a force acting to cause the sealing membrane 14 to be lifted from the underlayer (the organic EL layer 12 and the second electrode 13) is exerted, so that peeling is induced. Specifically, peeling tends to occur in the area indicated by the "X" mark B1 in FIG. 3, for example.

On the other hand, as indicated by the arrows Y1 and Y2 in FIG. 3, the cancellation between downward stresses is similarly weaker in an lower portion of the oblique surface of the protruding portion T. However, the downward stresses act in a direction in which the sealing membrane 14 is pressed against the underlayer, and therefore, peeling is less likely to be induced.

When the sealing membrane 14 has a tensile stress as its stress, a force acting to cause the sealing membrane 14 to be lifted is exerted at a lower portion of the oblique surface of the protruding portion T, so that peeling is induced, contrary from the case of the compressive stress.

That is, downward stresses are generated at an upper portion of the oblique surface of the protruding portion T, as indicated by the arrows Y7 and Y8 shown in FIG. 4.

However these downward stresses act in a direction in which the sealing membrane 14 is pressed against the underlayer, so that peeling is less likely to be induced.

On the other hand, upward stresses are generated at a lower portion of the oblique surface of the protruding portion T, as indicated by the arrows Y5 and Y6 in FIG. 4. Therefore, a force acting to cause the sealing membrane 14 to be lifted from the underlayer (the organic EL layer 12 and the second electrode 13) is exerted, so that peeling is induced. Specifically, peeling tends to occur, for example, in the area indicated by the "X" mark B2 in FIG. 4.

The induction of peeling in the sealing membrane 14 is more prominent when the level difference created by the protruding portion T is steep, when the size of the protruding portion T is large, when the stress of the sealing membrane 14 is large, and when the thickness of the sealing membrane 14 is large.

Next, the above-described value of the index in the organic EL display device 1 of the present embodiment will be described with reference to FIG. 5.

Referring to FIG. 5, in the present embodiment, when σ (MPa) represents an absolute value of the stress of the sealing membrane 14, t (μm) represents the thickness of the sealing membrane 14, and P (μm) represents the sum of the product of an oblique side length and an oblique side slope of a minute region on an oblique side of the protruding portion T, the value of an index N expressed by Expression (1) below is set to be less than or equal to 935 MPa·μm$^2$:

$$N = \sigma \cdot t \cdot P \qquad (1)$$

That is, in the present embodiment, the value of the index N is defined as an index for determining whether or not peeling of the sealing membrane occurs. As shown in FIG. 5, in order to obtain the value of the index N, a calculation range d is set in a cross section for each area in which a protruding portion T has occurred. In the calculation range, an oblique side slope S and an oblique side length ΔL of the underlayer in a minute region with a minute length Δx, indicated by the diagonal hatching in FIG. 5, on the oblique side of the protruding portion T are calculated. Then, the sum (integral value) P of the product of the oblique side slope S and the oblique side length ΔL is obtained. Furthermore, the value of the index N is determined based on the sum P and the product of the absolute value σ of the stress and the thickness t of the sealing membrane 14.

As the absolute value σ of the stress of the sealing membrane 14, a measured value obtained by using, for example, an FLX-series thin-film stress measurement apparatus manufactured by Toho Technology Corp. is used. As the thickness t of the sealing membrane 14, a thickness measured by using, for example, a spectroscopic ellipsometer manufactured by HORIBA is used.

The value of the index N is increased when the absolute value σ of the stress and the thickness t of the sealing membrane 14 are increased, when the protruding portion T is steep or the height of the protruding portion T is increased.

By calculating the values of the index N for individual underlayers on which a sealing membrane 14 is to be formed, it is possible to determine whether or not peeling occurs in the sealing membrane 14.

Specifically, the experiments carried out by the present inventors have confirmed that a sealing membrane 14 can be formed without causing peeling when N is less than or equal to 935 MPa·μm$^2$, as illustrated in Table 1 below. On the other hand, peeling occurred when N exceeds 935 MPa·μm$^2$.

TABLE 1

| Value of index N (MPa·μm$^2$) | Occurrence of peeling (o: No, x: Yes) | Sealing membrane Thickness (μm) | Stress (MPa) |
|---|---|---|---|
| 120 | o | 0.5 | 100 |
| 280 | o | 2.5 | 60 |
| 680 | o | 3.5 | 150 |
| 705 | o | 2.5 | 150 |
| 935 | o | 3.5 | 150 |
| 1110 | x | 3.5 | 150 |
| 1185 | x | 4.0 | 150 |
| 1550 | x | 3.5 | 150 |

Note that the experimental results shown in Table 1 are merely examples, and the sealing films used in the experimental results shown in Table 1 had different slopes of the oblique side of the edge cover 10 (i.e., different slopes of the protruding portion T).

Next, other experimental results for the value of the index N will be described in detail with reference to FIG. 6.

As shown in FIG. 6, when the shape of the oblique side of the protruding portion T of the underlayer, namely, the edge cover 10, the organic EL layer 12, and the second electrode 13, of the sealing membrane 14, is a shape that can be approximated with a sine function, the value of the index N at which no peeling occurs in the sealing membrane 14 can be determined, as illustrated in Table 2 below.

TABLE 2

| H (μm) | σ (MPa) | t (μm) | N (MPa·μm$^2$) |
|---|---|---|---|
| 0.1 | 300 | 5.0 | 201 |
| 1 | 300 | 2.0 | 714 |
| 1 | 150 | 5.0 | 893 |
| 3 | 400 | 0.1 | 256 |
| 3 | 200 | 0.5 | 641 |
| 5 | 400 | 0.1 | 656 |
| 5 | 50 | 1.0 | 820 |
| 10 | 100 | 0.1 | 629 |
| 10 | 10 | 1.0 | 629 |

That is, as shown in FIG. 6, the shape of the oblique side of a protruding portion T is approximated with a sine function by using the height H of the protruding portion T and the width D of the oblique side of the protruding portion T. Specifically, in FIG. 6, the height h at a given position x from origin "0" is expressed by Expression (2) below.

$$h = H \sin(\pi x / 2D) \qquad (2)$$

Therefore, the oblique side slope h' at the given position x is expressed by Expression (3) below, which is obtained by differentiating Expression (2) above by x and the oblique side length dL (i.e., ΔL shown in FIG. 5) at the given position x is expressed by Expression (4) below.

$$h' = (\pi H / 2D) \cos(\pi x / 2D) \qquad (3)$$

$$dL = \sqrt{(h'^2 + 1)} \ast dx \qquad (4)$$

Then, an integral value (sum) P is obtained by integrating the product of the oblique side slope h' and the oblique side length dL (x=0 to D). That is, an integral value P is calculated by using Expression (5) below.

$$P = \int dL * h'$$ (5)

$$= \alpha H \int \cos(\alpha x) \sqrt{\{(\alpha H \cos(\alpha x))^2 + 1\}} dx \, (x = 0 \text{ to } D)$$

where $\alpha = \pi H / 2D$

Here, the calculated results of the integral value P when the width D of the oblique side is set to 2 μm are shown in Table 3. As shown in Table 3, the height H of the protruding portion T is preferably set to a dimension within the range of 0.1 μm to 10 μm.

TABLE 3

|   | H (μm) | | | | |
|---|---|---|---|---|---|
|   | 0.1 | 1 | 3 | 5 | 10 |
| P | 0.1 | 1.2 | 6.4 | 16.4 | 62.9 |

As described above, by approximating the shape of the oblique side of the protruding portion T with a sine function, the integral value P is defined by the width D and the height H of the oblique side. Therefore, by calculating the index N for the height H of the protruding portion T, it is possible to determine the absolute value σ of the stress and the thickness t of the sealing membrane 14 that are allowable.

In the following, Table 4 shows specific examples of the calculated results of the index N when the height H of the oblique side is set to 0.1 μm, and the absolute value σ of the stress of the sealing membrane 14 and the thickness t of the sealing membrane 14 are varied. Table 5 show specific examples of the calculated results of the index N when the height H of the oblique side is set to 1 μm, and the absolute value σ of the stress of the sealing membrane 14 and the thickness t of the sealing membrane 14 are varied. Table 6 shows specific examples of the calculated results of the index N when the height H of the oblique side is set to 3 μm, and the absolute value σ of the stress of the sealing membrane 14 and the thickness t of the sealing membrane 14 are varied. Table 7 shows specific examples of the calculated results of the index N when the height H of the oblique side is set to 5 μm and the absolute value σ of the stress of the sealing membrane 14 and the thickness t of the sealing membrane 14 are varied. Table 8 shows specific examples of the calculated results of the index N when the height H of the oblique side is set to 10 μm, and the absolute value σ of the stress of the sealing membrane 14 and the thickness t of the sealing membrane 14 are varied. Furthermore, in Tables 4 to 8, (o) indicates that no peeling occurs in the sealing membrane 14, and (x) indicates that there is a risk of occurrence of peeling in the sealing membrane 14.

TABLE 4

|   |   | t (μm) | | | | |
|---|---|---|---|---|---|---|
| H = 0.1 μm | | 0.1 | 0.5 | 1 | 3 | 5 |
| σ (MPa) | 10 | 0.1 | 0.5 | 1.0 | 3.0 | 5.0 |
|   |   | (o) | (o) | (o) | (o) | (o) |
|   | 50 | 0.5 | 2.5 | 5.0 | 15.1 | 25.1 |
|   |   | (o) | (o) | (o) | (o) | (o) |
|   | 100 | 1.0 | 5.0 | 10.1 | 30.2 | 50.3 |
|   |   | (o) | (o) | (o) | (o) | (o) |
|   | 200 | 2.0 | 10.1 | 20.1 | 60.4 | 100.6 |
|   |   | (o) | (o) | (o) | (o) | (o) |

TABLE 4-continued

|   |   | t (μm) | | | | |
|---|---|---|---|---|---|---|
| H = 0.1 μm | | 0.1 | 0.5 | 1 | 3 | 5 |
|   | 400 | 4.0 | 20.1 | 40.2 | 120.7 | 201.2 |
|   |   | (o) | (o) | (o) | (o) | (o) |

As shown in Table 4, when the height H of the oblique side is 0.1 μm, the value of the index N is less than or equal to the above-described threshold, namely 935 MPa·μm² in any of the cases where the thickness t of the sealing membrane 14 is 0.1 μm, 0.5 μm, 1 μm, 3 μm, and 5 μm for an absolute value σ of the stress of the sealing membrane 14 of any of 10 MPa, 50 MPa, 100 MPa, 200 MPa, and 400 MPa. Therefore, no peeling occurs in the sealing membrane 14 in the cases shown in Table 4.

TABLE 5

|   |   | t (μm) | | | | |
|---|---|---|---|---|---|---|
| H = 1 μm | | 0.1 | 0.5 | 1 | 3 | 5 |
| σ (MPa) | 10 | 1.2 | 6.0 | 11.9 | 35.7 | 59.5 |
|   |   | (o) | (o) | (o) | (o) | (o) |
|   | 50 | 6.0 | 29.8 | 59.5 | 178.5 | 297.6 |
|   |   | (o) | (o) | (o) | (o) | (o) |
|   | 100 | 11.9 | 59.5 | 119.0 | 357.1 | 595.1 |
|   |   | (o) | (o) | (o) | (o) | (o) |
|   | 200 | 23.8 | 119.0 | 238.1 | 714.2 | 1190.3 |
|   |   | (o) | (o) | (o) | (o) | (x) |
|   | 400 | 47.6 | 238.1 | 476.1 | 1428.3 | 2380.6 |
|   |   | (o) | (o) | (o) | (x) | (x) |

As shown in Table 5, when the height H of the oblique side is 1 μm, the value of the index N exceeds the above-described threshold, namely 935 MPa·μm² only when the thickness t of the sealing membrane 14 is 5 μm for an absolute value σ of the stress of the sealing membrane 14 of 200 MPa, and only when the thickness t of the sealing membrane 14 is 3 μm or 5 μm for an absolute value σ of the stress of the sealing membrane 14 of 400 MPa. Therefore, among the cases shown in Table 5, there is a risk of occurrence of peeling in the sealing membrane 14 only when the thickness t of the sealing membrane 14 is 5 μm for an absolute value σ of the stress of the sealing membrane 14 of 200 MPa, and only when the thickness t of the sealing membrane 14 is 3 μm or 5 μm for an absolute value σ of the stress of the sealing membrane 14 of 400 MPa. No peeling occurs in the sealing membrane 14 in the other cases.

TABLE 6

|   |   | t (μm) | | | | |
|---|---|---|---|---|---|---|
| H = 3 μm | | 0.1 | 0.5 | 1 | 3 | 5 |
| σ (MPa) | 10 | 6.4 | 32.0 | 64.1 | 192.2 | 320.4 |
|   |   | (o) | (o) | (o) | (o) | (o) |
|   | 50 | 32.0 | 160.2 | 320.4 | 961.2 | 1601.9 |
|   |   | (o) | (o) | (o) | (x) | (x) |
|   | 100 | 64.1 | 320.4 | 640.8 | 1922.3 | 3203.8 |
|   |   | (o) | (o) | (o) | (x) | (x) |
|   | 200 | 128.2 | 640.8 | 1281.5 | 3844.6 | 6407.7 |
|   |   | (o) | (o) | (x) | (x) | (x) |
|   | 400 | 256.3 | 1281.5 | 2563.1 | 7689.2 | 12815.4 |
|   |   | (o) | (x) | (x) | (x) | (x) |

As shown in Table 6, when the height H of the oblique side is 3 μm, the value of the index N exceeds the above-described threshold, namely 935 MPa·μm² when the thickness t of the sealing membrane 14 is 3 µm or 5 µm for an absolute value σ of the stress of the sealing membrane 14 of 50 MPa, when the thickness t of the sealing membrane 14 is 3 µm or 5 µm for an absolute value σ of the stress of the sealing membrane 14 of 100 MPa, when the thickness t of the sealing membrane 14 is 1 µm, 3 µm, or 5 µm for an absolute value σ of the stress of the sealing membrane 14 of 200 MPa, and when the thickness t of the sealing membrane 14 is 0.5 µm, 1 µm, 3 µm, or 5 µm for an absolute value σ of the stress of the sealing membrane 14 of 400 MPa. Therefore, among the cases shown in Table 6, there is a risk of occurrence of peeling in a sealing membrane 14 when the thickness t of the sealing membrane 14 is 3 µm or 5 µm for an absolute value σ of the stress of the sealing membrane 14 of 50 MPa, when the thickness t of the sealing membrane 14 is 3 µm or 5 µm for an absolute value σ of the stress of the sealing membrane 14 of 100 MPa, when the thickness t of the sealing membrane 14 is 1 µm, 3 µm, or 5 µm for an absolute value σ of the stress of the sealing membrane 14 of 200 MPa, and when the thickness t of the sealing membrane 14 is 0.5 µm, 1 µm, 3 µm, or 5 µm for an absolute value σ of the stress of the sealing membrane 14 of 400 MPa. No peeling occurs in the sealing membrane 14 in the other cases.

TABLE 7

| H = 5 µm | | t (µm) | | | | |
|---|---|---|---|---|---|---|
| | | 0.1 | 0.5 | 1 | 3 | 5 |
| σ (MPa) | 10 | 16.4 (○) | 82.0 (○) | 163.9 (○) | 491.8 (○) | 819.7 (○) |
| | 50 | 82.0 (○) | 409.9 (○) | 819.7 (○) | 2459.1 (x) | 4098.5 (x) |
| | 100 | 163.9 (○) | 819.7 (○) | 1639.4 (x) | 4918.2 (x) | 8197.0 (x) |
| | 200 | 327.9 (○) | 1639.4 (x) | 3278.8 (x) | 9836.5 (x) | 16394.1 (x) |
| | 400 | 655.8 (○) | 3278.8 (x) | 6557.6 (x) | 19672.9 (x) | 32788.2 (x) |

As shown in Table 7, when the height H of the oblique side is 5 µm, the value of the index N exceeds the above-described threshold, namely 935 MPa·µm² when the thickness t of the sealing membrane 14 is 3 µm or 5 µm for an absolute value σ of the stress of the sealing membrane 14 of 50 MPa, when the thickness t of the sealing membrane 14 is 1 µm, 3 µm, or 5 µm for an absolute value σ of the stress of the sealing membrane 14 of 100 MPa, when the thickness t of the sealing membrane 14 is 0.5 µm, 1 µm, 3 µm, or 5 µm for an absolute value σ of the stress of the sealing membrane 14 of 200 MPa, and when the thickness t of the sealing membrane 14 is 0.5 µm, 1 µm, 3 µm, or 5 µm for an absolute value σ of the stress of the sealing membrane 14 of 400 MPa. Therefore, among the cases shown in Table 7, there is a risk of occurrence of peeling in a sealing membrane 14 when the thickness t of the sealing membrane 14 is 3 µm or 5 µm for an absolute value σ of the stress of the sealing membrane 14 of 50 MPa, when the thickness t of the sealing membrane 14 is 1 µm, 3 µm, or 5 µm for an absolute value σ of the stress of the sealing membrane 14 of 100 MPa, when the thickness t of the sealing membrane 14 is 0.5 µm, 1 µm, 3 µm, or 5 µm for an absolute value σ of the stress of the sealing membrane 14 of 200 MPa, and when the thickness t of the sealing membrane 14 is 0.5 µm, 1 µm, 3 µm, or 5 µm for an absolute value σ of the stress of the sealing membrane 14 of 400 MPa. No peeling occurs in the sealing membrane 14 in the other cases.

TABLE 8

| H = 10 µm | | t (µm) | | | | |
|---|---|---|---|---|---|---|
| | | 0.1 | 0.5 | 1 | 3 | 5 |
| σ (MPa) | 10 | 62.9 (○) | 314.7 (○) | 629.4 (○) | 1888.3 (x) | 3147.1 (x) |
| | 50 | 314.7 (○) | 1573.6 (x) | 3147.1 (x) | 9441.3 (x) | 15735.5 (x) |
| | 100 | 629.4 (○) | 3147.1 (x) | 6294.2 (x) | 1882.6 (x) | 31471.0 (x) |
| | 200 | 1258.8 (x) | 6294.2 (x) | 12588.4 (x) | 37765.2 (x) | 62942.0 (x) |
| | 400 | 2517.7 (x) | 12588.4 (x) | 25176.8 (x) | 75530.4 (x) | 125884.1 (x) |

As shown in Table 8, when the height H of the oblique side is 10 µm, the value of the index N exceeds the above-described threshold, namely 935 MPa·µm² when the thickness t of the sealing membrane 14 is 3 µm or 5 µm for an absolute value σ of the stress of the sealing membrane 14 of 10 MPa, when the thickness t of the sealing membrane 14 is 0.5 µm, 1 µm, 3 µm, or 5 µm for an absolute value σ of the stress of the sealing membrane 14 of 50 MPa, when the thickness t of the sealing membrane 14 is 0.5 µm, 1 µm, 3 µm, or 5 µm for an absolute value σ of the stress of the sealing membrane 14 of 100 MPa, when the thickness t of the sealing membrane 14 is 0.1 µm, 0.5 µm, 1 µm, 3 µm, or 5 µm for an absolute value σ of the stress of the sealing membrane 14 of 200 MPa, and when the thickness t of the sealing membrane 14 is 0.1 µm, 0.5 µm, 1 µm, 3 µm, or 5 µm for an absolute value σ of the stress of the sealing membrane 14 of 400 MPa. Therefore, among the cases shown in Table 8, there is a risk of occurrence of peeling in a sealing membrane 14 when the thickness t of the sealing membrane 14 is 3 µm or 5 µm for an absolute value σ of the stress of the sealing membrane 14 of 10 MPa, when the thickness t of the sealing membrane 14 is 0.5 µm, 1 µm, 3 µm, or 5 µm for an absolute value σ of the stress of the sealing membrane 14 of 50 MPa, when the thickness t of the sealing membrane 14 is 0.5 µm, 1 µm, 3 µm, or 5 µm for an absolute value σ of the stress of the sealing membrane 14 of 100 MPa, when the thickness t of the sealing membrane 14 is 0.1 µm, 0.5 µm, 1 µm, 3 µm, or 5 µm for an absolute value σ of the stress of the sealing membrane 14 of 200 MPa, and when the thickness t of the sealing membrane 14 is 0.1 µm, 0.5 µm, 1 µm, 3 µm, or 5 µm for an absolute value σ of the stress of the sealing membrane 14 of 400 MPa. No peeling occurs in the sealing membrane 14 in the other cases.

Next, cases where the integration range of the integral value P is changed will be described in detail.

The present inventors obtained calculated results of an integral value P for the height H of the oblique side of the uneven portion T shown in FIG. 6 when the integration range for obtaining the integral value P was changed. That is, as shown in Table 9 below, the integral value P changed when the integration range was changed.

TABLE 9

| | H (µm) | | | | |
|---|---|---|---|---|---|
| | 0.1 | 1 | 3 | 5 | 10 |
| h = 0 to H | 0.10 | 1.19 | 6.41 | 16.39 | 62.94 |
| h = 0.01 H to 0.99 H | 0.10 | 1.16 | 6.26 | 16.03 | 61.58 |
| h = 0.05 H to 0.95 H | 0.09 | 1.08 | 5.89 | 15.13 | 58.30 |
| h = 0.1 H to 0.9 H | 0.08 | 0.96 | 5.27 | 13.59 | 52.45 |

The integral values P shown in Table 9 were obtained by Expression (6) below in which the minimum value min and the maximum value max of the integration range of x were used. Note that the integration range of x is calculated from h by using Expression (2).

$$P = \int dL * h'$$
$$= \alpha H \int \cos(\alpha x) \sqrt{\{(\alpha H \cos(\alpha x))^2 + 1\}} dx (x = \min \text{ to } \max)$$
where $\alpha = \pi H / 2D$ (6)

In Table 9, the rate of change of the integral value P when the integration range was changed to 0.05 H to 0.95 H is 7.4%, relative to the integral value P when the integration range was not changed, and the rate of change of the integral value P when the integration range was changed to 0.1 H to 0.9 H is 16.7%, relative to the integral value P when the integration range was not changed. In this way, when the integration range is significantly changed, the integral value P changed significantly, and therefore, there is the possibility that the value of the index N cannot be obtained accurately.

On the other hand, in Table 9, the rate of change of the integral value P when the integration range was changed to 0.01 H to 0.99 H is 2.2%, relative to the integral value P when the integration range was not changed. That is, when the integration range was changed to 0.01 H to 0.99 H, the value of the index N is hardly affected. Specifically, the values of the index N when the height H of the oblique side was 10 μm, for example, were as shown as Table 10 below. In Table 10, (o) indicates that no peeling occurs in the sealing membrane 14, and (x) indicates that there is a risk of occurrence of peeling in the sealing membrane 14.

TABLE 10

| H = 10 μm | | t (μm) | | | |
|---|---|---|---|---|---|
| | | 0.1 | 0.5 | 1 | 3 | 5 |
| σ (MPa) | 10 | 61.6 (o) | 307.9 (o) | 615.8 (o) | 1847.4 (x) | 3079.0 (x) |
| | 50 | 307.9 (o) | 1539.5 (x) | 3079.0 (x) | 9237.1 (x) | 15395.2 (x) |
| | 100 | 615.8 (o) | 3079.0 (x) | 6158.1 (x) | 18474.2 (x) | 30790.3 (x) |
| | 200 | 1231.6 (x) | 6158.1 (x) | 12316.1 (x) | 36948.4 (x) | 61580.7 (x) |
| | 400 | 2463.2 (x) | 12316.1 (x) | 24632.3 (x) | 73896.8 (x) | 123161.3 (x) |

As shown in Table 10, the values of the index N were substantially the same as those shown in Table 8 when the integration range was not changed, and the results of determination of whether or not pealing occurs in the sealing membrane 14 were also the same as those shown in Table 8.

In the sealing film F according to the present embodiment configured in the above-described manner, the value of the index N expressed by Expression (1) above is set to be less than or equal to 935 MPa·μm². Thus, according to the present embodiment, it is possible to configure a sealing film F that can be easily produced at a low cost even when higher definition is achieved, unlike the above-described conventional example.

According to the present embodiment, the height dimension of the protruding portion T has a value within the range of 0.1 μm to 10 μm, and therefore, it is possible to reliably prevent the occurrence of pealing in the sealing membrane 14.

According to the present embodiment, the sealing membrane 14 is formed of a stacked structure including the inorganic layer 14a and the organic layer 14b, and therefore, it is possible to easily enhance the sealing properties of the sealing membrane 14.

Since the organic EL element 4 and the organic EL display device 1 of the present embodiment use the sealing film F, it is possible to configure an organic EL element 4 and an organic EL display device 1 that can be easily produced at a low cost even when higher definition is achieved.

Second Embodiment

Figure 7:
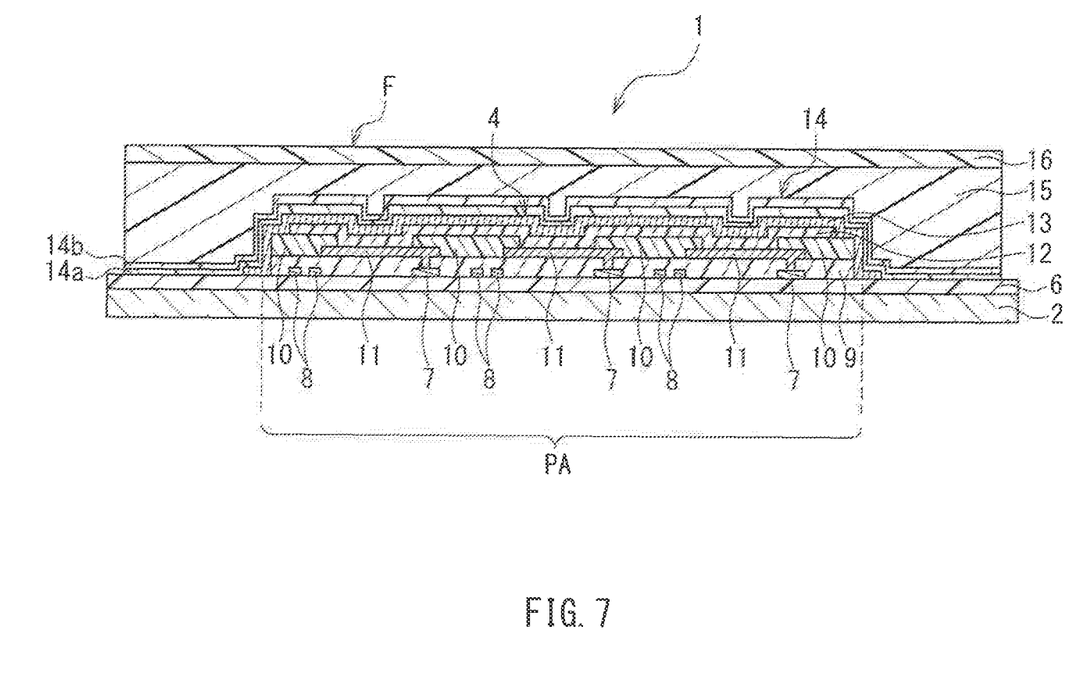
FIG. 7 is a cross-sectional view showing a cross section of an organic EL display device according to a second embodiment of the present invention.
Figure 8:
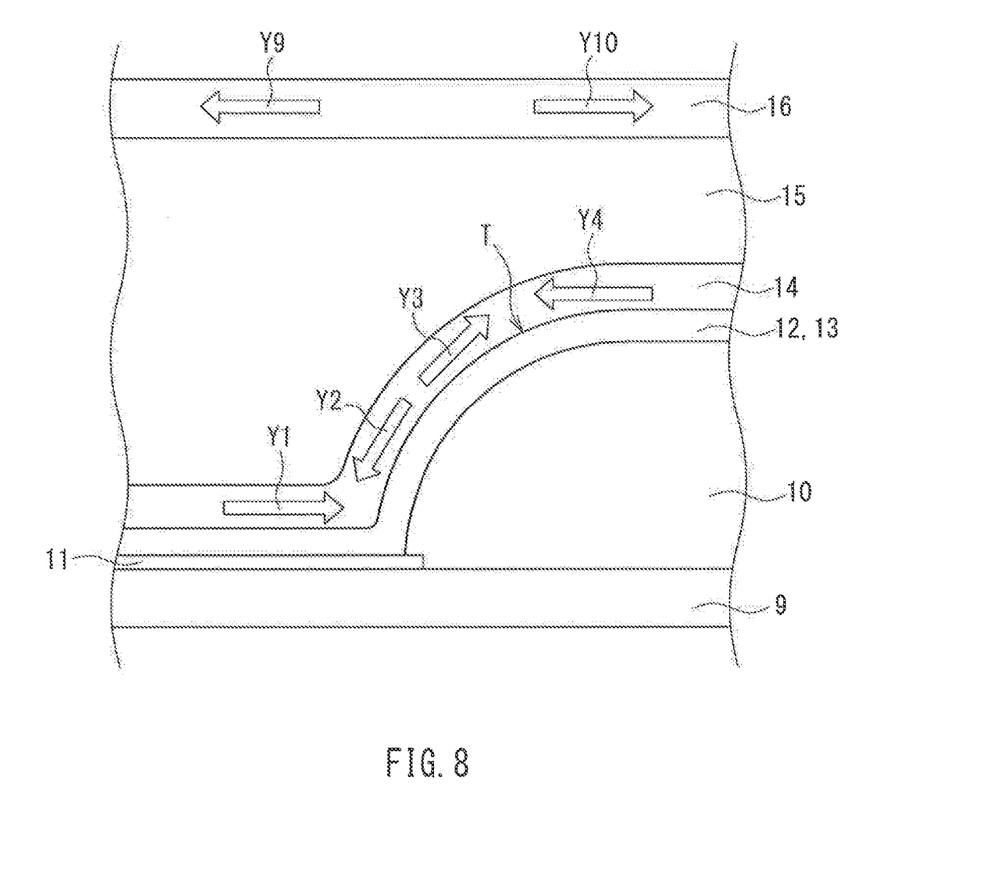
FIG. 8 is a diagram illustrating forces acting on first and second sealing membranes provided in the organic EL display device shown in FIG. 7.

FIG. 7 is a cross-sectional view showing a cross section of an organic EL display device according to a second embodiment of the present invention. FIG. 8 is a diagram illustrating forces acting on first and second sealing membranes provided in the organic EL display device shown in FIG. 7.

In FIG. 7, a main difference between the present embodiment and the above-described first embodiment is that the present embodiment includes a first sealing membrane serving as a sealing membrane, a buffer layer that is provided so as to cover the first sealing membrane and is formed of a material having elasticity so as to reduce the level difference created by a protruding portion in the first sealing membrane, and a second sealing membrane provided so as to cover the buffer layer. Note that elements common to those of the above-described first embodiment are denoted by the same reference numerals, and redundant description thereof has been omitted.

That is, as shown in FIG. 7, a sealing film F of the present embodiment includes a first sealing membrane 14 serving as a sealing membrane, a buffer layer 5 provided so as to cover the first sealing membrane 14, and a second sealing membrane 16 provided so as to cover the buffer layer 15.

The buffer layer 15 is formed of a material having elasticity and is configured to reduce the level difference created by a protruding portion in the first sealing membrane 14. Also, the buffer layer 15 is configured to have a thickness larger than the dimension of the level difference in the first sealing membrane 14. Specifically, for example, silicon carbide oxide, acrylate, polyurea, parylene, polyimide, or polyamide is used for the buffer layer 15, and the buffer layer 15 is configured to reduce the level difference created by an uneven portion T in the first sealing membrane 14 to form a flat surface.

As shown in FIG. 7, the second sealing membrane 16 is provided in a uniform thickness on the buffer layer 15 that is formed to be flat. Since the second sealing membrane 16 is provided in this manner, stresses generated in the second sealing membrane 16 cancel each other as shown in the arrows Y9 and Y10 in FIG. 8.

Furthermore, the buffer layer 15 is formed of a material having elasticity, and thus prevents the stress of the second sealing membrane 16 from being transmitted to the first sealing membrane 14 side. Accordingly, similarly to the sealing film F of the first embodiment, the sealing film F of the present embodiment makes it possible to prevent peeling in the first sealing membrane 14 by setting the value of the index N to be less than or equal to 935 MPa·μm².

With the above-described configuration, the present embodiment can achieve the same operation and effect as those of the above-described first embodiment. The present embodiment includes the first sealing membrane 14 serving as a sealing membrane, the buffer layer 15 that is provided so as to cover the first sealing membrane 14 and is formed of a material having elasticity to reduce the level difference created by the protruding portion T in the first sealing membrane 14, and the second sealing membrane 16 provided so as to cover the buffer layer 15. Thus, according to the present embodiment, it is possible to reduce a level difference created by the protruding portion T in the first sealing membrane 14, and prevent the stress of the second sealing membrane 16 from being transmitted to the first sealing membrane 14 by using the elasticity of the buffer layer 15, thus making it possible to reliably prevent the occurrence of peeling in the first sealing membrane 14.

In the present embodiment, the buffer layer 15 has a thickness larger than the dimension of the level difference in the first sealing membrane 14, thus making it possible to reliably reduce the level difference created by the protruding portion T in the first sealing membrane 14.

Third Embodiment

Figure 9:
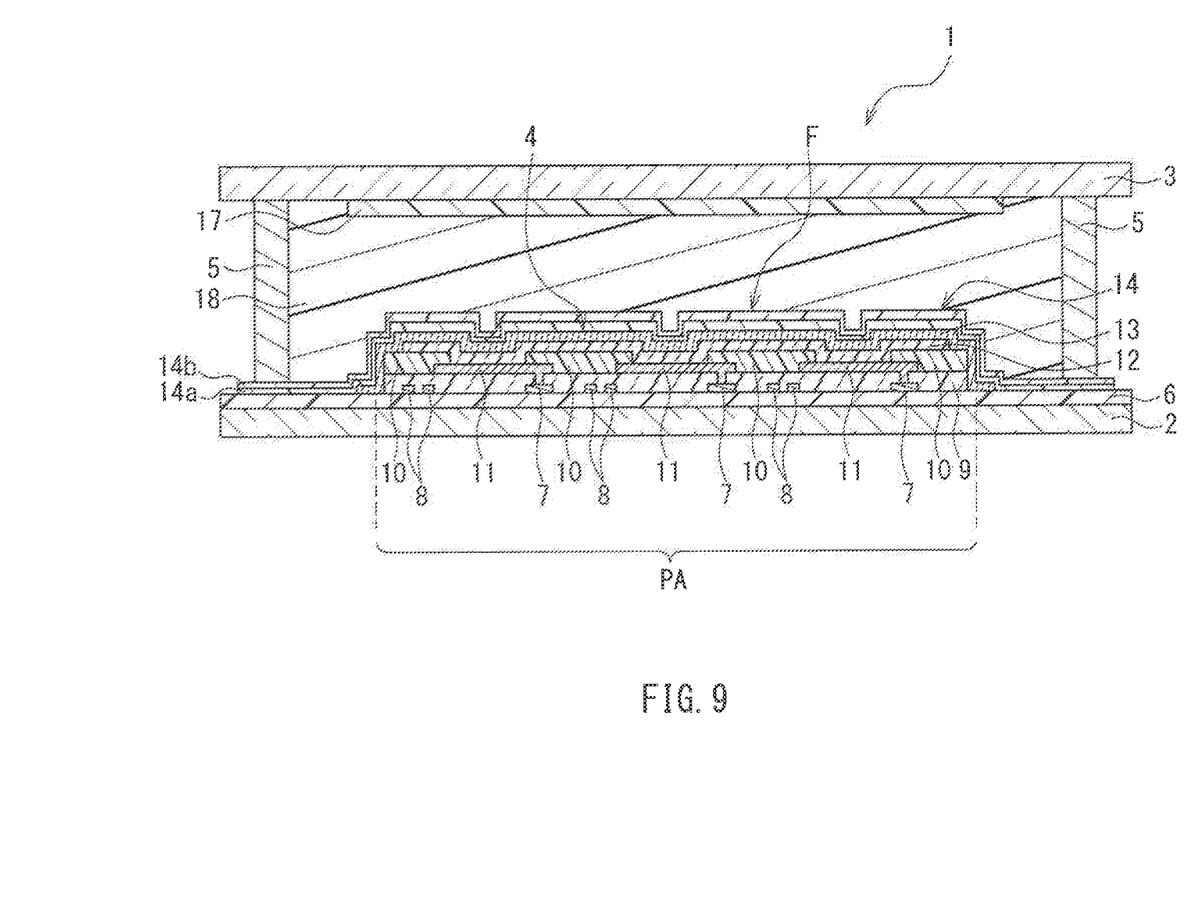
FIG. 9 is a cross-sectional view showing a cross section of an organic EL display device according to a third embodiment of the present invention.

FIG. 9 is a cross-sectional view showing a cross section of an organic EL display device according to a third embodiment of the present invention.

In FIG. 9, a main difference between the present embodiment and the above-described first embodiment is that an opposing substrate that opposes a TFT substrate and a frame-shaped sealing member that encapsulates an organic EL element between the TFT substrate and the opposing substrate are provided. Note that elements common to those of the above-described first embodiment are denoted by the same reference numerals, and redundant description thereof has been omitted.

That is, in FIG. 9, in the organic EL display device 1 of the present embodiment, the organic EL element 4 is encapsulated by a TFT substrate 2, an opposing substrate 3 provided so as to oppose the TFT substrate 2, and a frame-shaped sealing member 5 provided between the TFT substrate 2 and the opposing substrate 3.

For the opposing substrate 3, for example, a glass material or a film having flexibility (bendability) is used, as with the TFT substrate 2. A color filter 17 is provided on the surface of the opposing substrate 3 that faces the organic EL element 4, so that the emission characteristics such as the emission quality of the above-described RGB sub-pixels can be enhanced.

The sealing member 5 may be formed of for example, a material in which spacers that define a cell gap between the TFT substrate 2 and the opposing substrate 3 and inorganic particles are dispersed in a resin such as an epoxy resin. As shown in FIG. 9, the sealing member 5 is formed in the shape of a frame around the pixel area PA. As a result of inorganic particles being dispersed therein, the sealing member 5 can further reduce the moisture permeability.

In the organic EL display device 1 of the present embodiment, a filler layer 18 is provided between the TFT substrate 2, the opposing substrate 3, and the sealing member 5 so as to cover the organic EL element 4 and the sealing film F. For the filler layer 18, for example, a material in which particles having a moisture absorption function, such as a metal oxide such as aluminum hydroxide or calcium oxide and activated carbon, are dispersed in a resin is used.

With the above-described configuration, the present embodiment can achieve the same operation and effect as those of the above-described first embodiment. In the present embodiment, the opposing substrate 3 that opposes the TFT substrate 2 and the sealing member 5 that encapsulates the organic EL element 4 between the TFT substrate 2 and the opposing substrate 3 are provided, and therefore it is possible to more reliably prevent degradation of the organic EL element 4.

Since the filler layer 18 in which a material having a drying function is dispersed is provided between the TFT substrate 2, the opposing substrate 3, and the sealing member 5 in the present embodiment, it is possible to further enhance the sealing properties for the organic EL element 4.

Note that the above-described embodiments are all illustrative and not limiting. The technical scope of the present invention is defined by the claims, and all changes within a range equivalent to the configurations recited in the claims are also included in the technical scope of the present invention.

For example, the foregoing description has illustrated a case where a sealing film is used for an organic EL element and an organic EL display device. However, the sealing film of the present invention is not limited thereto. The sealing film of the present invention is not limited in any way as long as it includes a substrate, a vapor-deposited membrane that is formed on the substrate and includes a protruding portion, and a sealing membrane provided so as to cover the vapor-deposited membrane. For example, the sealing film is applicable to an inorganic EL element including an inorganic compound.

Although the foregoing description has described a case where the present invention is applied to an organic EL display device of the active matrix type that includes TFTs (thin film transistors) 7, the present invention is not limited thereto, and is also applicable to an organic EL display device of the passive matrix type in which no thin film transistor is provided.

Although the foregoing description has described a case where the present invention is applied to an organic EL display device, the present invention is not limited thereto, and is also applicable, for example, to a lighting device such as a backlight device.

Although the foregoing description has described a case where the edge cover 10 is shown as an exemplary cause of formation of the protruding portion T on the underlayer of the sealing membrane 14, the cause of formation of the protruding portion T on the underlayer of the sealing membrane 14 is not limited thereto. Specifically, for example, contact holes formed in the interlayer insulating film 9, the wirings under the interlayer insulating film 9, mask spacers formed on the TFT substrate 2 in order to prevent the organic EL element 4 from being damaged as a result of collision between a vapor deposition mask and the TFT substrate 2 during vapor deposition of the organic EL layer 12 or the second electrode 13, or gap spacers provided on the edge cover 10 in a configuration in which the opposing substrate 3 is provided may be the cause of formation of the protruding portion T on the underlayer of the sealing membrane 14.

Aside from the configurations described in the foregoing description, it is possible to adopt a configuration in which the second and third embodiments are appropriately combined.

INDUSTRIAL APPLICABILITY

The present invention is useful for a sealing film that can be easily produced at a low cost even when higher definition is achieved, an organic EL element using the same, and an organic EL display device.

DESCRIPTION OF REFERENCE NUMERALS

1 Organic EL display device
2 TFT substrate (substrate)
3 Opposing substrate
4 Organic EL element (electroluminescence element)
5 Sealing member
12 Organic EL layer (vapor-deposited membrane)
13 Second electrode (vapor-deposited membrane)
14 Sealing membrane (first sealing membrane)
15 Buffer layer
16 Second sealing membrane
18 Filler layer
F Sealing film
T Protruding portion

The invention claimed is:

1. A sealing film comprising:
a substrate;
a first electrode, an organic electroluminescence (EL) layer, and a vapor-deposited membrane on the substrate, the vapor-deposited membrane including a protruding portion that is a second electrode;
an edge cover between the first electrode and the organic EL layer; and
a sealing membrane that covers the vapor-deposited membrane, wherein,
when σ represents an absolute value of a stress of the sealing membrane, t represents a thickness of the sealing membrane, and P represents a sum of a product of an oblique side length and an oblique side slope in a minute region on an oblique side of the protruding portion, a value of an index N expressed by Expression (1) below is less than or equal to 935 MPa·μm²:

$$N = \sigma \cdot t \cdot P \quad (1),$$

an opening is provided in the edge cover that exposes the first electrode through the opening,
the opening corresponds to an emissive region,
the protruding portion corresponds to an end portion of the edge cover that defines the opening,
the sealing membrane is defined by a stacked structure including an inorganic layer as a lowermost layer of the stacked structure and an organic layer that covers the inorganic layer, and
the inorganic layer is in contact with the vapor-deposited membrane.

2. The sealing film according to claim 1, wherein a height dimension of the protruding portion has a value within a range of 0.1 μm to 10 μm.

3. The sealing film according to claim 1, further comprising:
a first sealing membrane serving as the sealing membrane;
a buffer layer that is provided to cover the first sealing membrane and includes a material having elasticity to reduce a level difference created by the protruding portion in the first sealing membrane; and
a second sealing membrane provided to cover the buffer layer.

4. The sealing film according to claim 3, wherein the buffer layer has a thickness larger than a dimension of a level difference in the first sealing membrane.

5. An organic EL element, wherein the sealing film according to claim 1 is used.

6. An organic EL display device, wherein the organic EL element according to claim 5 is used.

7. The organic EL display device according to claim 6, comprising:
an opposing substrate that opposes the substrate; and
a sealing member that encapsulates the organic EL element between the substrate and the opposing substrate.

8. The organic EL display device according to claim 7, wherein a filler layer is provided between the substrate, the opposing substrate, and the sealing member.

9. The sealing film according to claim 1, wherein
the absolute value of the stress of the sealing membrane is within a range of 200 MPa to 40M Pa,
a value of thickness of the sealing membrane is within 0.1 μm to 1 μm, and
a height dimension of the protruding portion has a value not less than 0.1 μm and less than 3 μm.

10. The sealing film according to claim 1, wherein
the absolute value of the stress of the sealing membrane is within a range of 200 MPa to 400 MPa,
a value of thickness of the sealing membrane is within 1 μm to 3 μm, and
a height dimension of the protruding portion has a value not less than 0.1 μm and less than 0.5 μm.

11. The sealing film according to claim 1, wherein
the absolute value of the stress of the sealing membrane is within a range of 200 MPa to 400 MPa,
a value of thickness of the sealing membrane is within 3 μm to 5 μm, and
a height dimension of the protruding portion has a value not less than 0.1 μm and less than 0.5 μm.

12. The sealing film according to claim 1, wherein
the absolute value of the stress of the sealing membrane is within a range of 50 MPa to 100 MPa,
a value of thickness of the sealing membrane is within 5 μm to 10 μm, and
a height dimension of the protruding portion has a value not less than 0.1 μm and less than 0.5 μm.

13. The sealing film according to claim 1, wherein a total thickness of the inorganic layer and the organic layer is less than a height of the protruding portion.

* * * * *